(12) United States Patent
Potter

(10) Patent No.: US 7,287,328 B2
(45) Date of Patent: Oct. 30, 2007

(54) METHODS FOR DISTRIBUTED ELECTRODE INJECTION

(75) Inventor: Michael D. Potter, Churchville, NY (US)

(73) Assignee: Rochester Institute of Technology, Rochester, NY (US)

(*) Notice: Subject to any disclaimer, the term of this patent is extended or adjusted under 35 U.S.C. 154(b) by 376 days.

(21) Appl. No.: 10/924,496

(22) Filed: Aug. 24, 2004

(65) Prior Publication Data
US 2005/0044955 A1   Mar. 3, 2005

Related U.S. Application Data

(60) Provisional application No. 60/498,891, filed on Aug. 29, 2003.

(51) Int. Cl.
H01B 19/00 (2006.01)

(52) U.S. Cl. ............ 29/886; 29/619; 29/746; 29/842; 73/514.32; 257/E21.247; 257/E23.173; 428/446

(58) Field of Classification Search ............... 29/886, 29/619, 746, 842; 73/514.32; 257/E21.247; 257/E23.173; 428/446
See application file for complete search history.

(56) References Cited

U.S. PATENT DOCUMENTS

| | | |
|---|---|---|
| 2,567,373 A | 9/1951 | Giacoletto et al. |
| 2,588,513 A | 3/1952 | Giacoletta |
| 2,978,066 A | 4/1961 | Nodolf |
| 3,118,022 A | 1/1964 | Sessler et al. |
| 3,397,278 A | 8/1968 | Pomerantz |
| 3,405,334 A | 10/1968 | Jewett et al. |
| 3,487,610 A | 1/1970 | Brown et al. |
| 3,715,500 A | 2/1973 | Sessler et al. |
| 3,731,163 A | 5/1973 | Shuskus |
| 3,742,767 A | 7/1973 | Bernard et al. |
| 3,786,495 A | 1/1974 | Spence |
| 3,858,307 A | 1/1975 | Yoshimura et al. |
| 3,924,324 A | 12/1975 | Kodera |

(Continued)

FOREIGN PATENT DOCUMENTS

JP   58-029379 A   2/1983

(Continued)

OTHER PUBLICATIONS

Aguilera et al., "Electron Energy Distribution at the Insulator-Semiconductor Interface in AC Thin Film Electroluminescent Display Devices," *IEEE Transactions on Electron Devices* 41(8):1357-1363 (1994).

(Continued)

*Primary Examiner*—A. Dexter Tugbang
*Assistant Examiner*—Tim Phan
(74) *Attorney, Agent, or Firm*—Nixon Peabody LLP

(57) ABSTRACT

Methods for injecting charge include providing a target comprising a first layer on a second layer, coupling a conductive base to the second layer, and providing a medium which is in contact with at least a portion of the first layer. An electrode is positioned to face and is spaced from the first layer and is at least partially in contact with the medium. An electric field is provided across the first and second layers to inject charge to an interface between the first layer and the second layer.

16 Claims, 3 Drawing Sheets

U.S. PATENT DOCUMENTS

| | | |
|---|---|---|
| 4,047,214 A | 9/1977 | Francombe et al. |
| 4,102,202 A | 7/1978 | Ferriss |
| 4,115,914 A | 9/1978 | Harari |
| 4,126,822 A | 11/1978 | Wahlstrom |
| 4,160,882 A | 7/1979 | Driver |
| 4,166,729 A | 9/1979 | Thompson et al. |
| 4,285,714 A | 8/1981 | Kirkpatrick |
| 4,288,735 A | 9/1981 | Crites |
| 4,340,953 A | 7/1982 | Iwamura et al. |
| 4,375,718 A | 3/1983 | Wadsworth et al. |
| 4,490,772 A | 12/1984 | Blickstein |
| 4,504,550 A | 3/1985 | Pook |
| 4,513,049 A | 4/1985 | Yamasaki et al. |
| 4,581,624 A | 4/1986 | O'Connor |
| 4,585,209 A | 4/1986 | Aine et al. |
| 4,626,263 A | 12/1986 | Inoue et al. |
| 4,626,729 A | 12/1986 | Lewiner et al. |
| 4,701,640 A | 10/1987 | Flygstad et al. |
| 4,716,331 A | 12/1987 | Higgins, Jr. |
| 4,736,629 A | 4/1988 | Cole |
| 4,789,504 A | 12/1988 | Ohmori et al. |
| 4,789,803 A | 12/1988 | Jacobsen et al. |
| 4,794,370 A | 12/1988 | Simpson et al. |
| 4,874,659 A | 10/1989 | Ando et al. |
| 4,905,701 A | 3/1990 | Cornelius |
| 4,922,756 A | 5/1990 | Henrion |
| 4,944,854 A | 7/1990 | Felton et al. |
| 4,945,068 A | 7/1990 | Sugaya |
| 4,958,317 A | 9/1990 | Terada et al. |
| 4,965,244 A | 10/1990 | Weaver et al. |
| 4,996,627 A | 2/1991 | Zias et al. |
| 4,997,521 A | 3/1991 | Howe et al. |
| 5,020,030 A | 5/1991 | Huber |
| 5,050,435 A | 9/1991 | Pinson |
| 5,051,643 A | 9/1991 | Dworsky et al. |
| 5,054,081 A | 10/1991 | West |
| 5,057,710 A | 10/1991 | Nishiura et al. |
| 5,081,513 A | 1/1992 | Jackson et al. |
| 5,082,242 A | 1/1992 | Bonne et al. |
| 5,088,326 A | 2/1992 | Wada et al. |
| 5,092,174 A | 3/1992 | Reidemeister et al. |
| 5,095,752 A | 3/1992 | Suzuki et al. |
| 5,096,388 A | 3/1992 | Weinberg |
| 5,108,470 A | 4/1992 | Pick |
| 5,112,677 A | 5/1992 | Tani et al. |
| 5,118,942 A | 6/1992 | Hamade |
| 5,129,794 A | 7/1992 | Beatty |
| 5,132,934 A | 7/1992 | Quate et al. |
| 5,143,854 A | 9/1992 | Pirrung et al. |
| 5,156,810 A | 10/1992 | Ribi |
| 5,164,319 A | 11/1992 | Hafeman et al. |
| 5,180,623 A | 1/1993 | Ohnstein |
| 5,189,641 A | 2/1993 | Arakawa |
| 5,207,103 A | 5/1993 | Wise et al. |
| 5,228,373 A | 7/1993 | Welsch |
| 5,231,045 A | 7/1993 | Miura et al. |
| 5,238,223 A | 8/1993 | Mettner et al. |
| 5,256,176 A | 10/1993 | Matsuura et al. |
| 5,262,000 A | 11/1993 | Welbourn et al. |
| 5,284,179 A | 2/1994 | Shikida et al. |
| 5,284,692 A | 2/1994 | Bell |
| 5,323,999 A | 6/1994 | Bonne et al. |
| 5,334,238 A | 8/1994 | Goodson et al. |
| 5,336,062 A | 8/1994 | Richter |
| 5,336,904 A | 8/1994 | Kusunoki |
| 5,348,571 A | 9/1994 | Weber |
| 5,349,492 A | 9/1994 | Kimura et al. |
| 5,355,577 A | 10/1994 | Cohn |
| 5,365,790 A | 11/1994 | Chen et al. |
| 5,367,429 A | 11/1994 | Tsuchitani et al. |
| 5,380,396 A | 1/1995 | Shikida et al. |
| 5,392,650 A | 2/1995 | O'Brien et al. |
| 5,417,235 A | 5/1995 | Wise et al. |
| 5,417,312 A | 5/1995 | Tsuchitani et al. |
| 5,419,953 A | 5/1995 | Chapman |
| 5,441,597 A | 8/1995 | Bonne et al. |
| 5,445,008 A | 8/1995 | Wachter et al. |
| 5,474,599 A | 12/1995 | Cheney et al. |
| 5,488,864 A | 2/1996 | Stephan |
| 5,491,604 A | 2/1996 | Nguyen et al. |
| 5,496,507 A | 3/1996 | Angadjivand et al. |
| 5,512,882 A | 4/1996 | Stetter et al. |
| 5,519,240 A | 5/1996 | Suzuki |
| 5,520,522 A | 5/1996 | Rathore et al. |
| 5,526,172 A | 6/1996 | Kanack |
| 5,567,336 A | 10/1996 | Tatah |
| 5,578,976 A | 11/1996 | Yao |
| 5,591,679 A | 1/1997 | Jakobsen et al. |
| 5,593,476 A | 1/1997 | Coppom |
| 5,593,479 A | 1/1997 | Frey et al. |
| 5,596,194 A | 1/1997 | Kubena et al. |
| 5,616,844 A | 4/1997 | Suzuki et al. |
| 5,635,739 A | 6/1997 | Grieff et al. |
| 5,640,133 A | 6/1997 | MacDonald et al. |
| 5,668,303 A | 9/1997 | Giesler et al. |
| 5,671,905 A | 9/1997 | Hopkins, Jr. |
| 5,677,617 A | 10/1997 | Tokai et al. |
| 5,698,771 A | 12/1997 | Shields et al. |
| 5,739,834 A | 4/1998 | Okabe et al. |
| 5,747,692 A | 5/1998 | Jacobsen et al. |
| 5,771,148 A | 6/1998 | Davis |
| 5,777,977 A | 7/1998 | Fujiwara et al. |
| 5,788,468 A | 8/1998 | Dewa et al. |
| 5,793,485 A | 8/1998 | Gourley |
| 5,798,146 A | 8/1998 | Murokh et al. |
| 5,807,425 A | 9/1998 | Gibbs |
| 5,812,163 A | 9/1998 | Wong |
| 5,839,062 A | 11/1998 | Nguyen et al. |
| 5,846,302 A | 12/1998 | Putro |
| 5,846,708 A | 12/1998 | Hollis et al. |
| 5,871,567 A | 2/1999 | Covington et al. |
| 5,874,675 A | 2/1999 | Edmans et al. |
| 5,897,097 A | 4/1999 | Biegelsen et al. |
| 5,908,603 A | 6/1999 | Tsai et al. |
| 5,914,553 A | 6/1999 | Adams et al. |
| 5,919,364 A | 7/1999 | Lebouitz et al. |
| 5,920,011 A | 7/1999 | Hulsing, II |
| 5,941,501 A | 8/1999 | Biegelsen et al. |
| 5,955,932 A | 9/1999 | Nguyen et al. |
| 5,959,516 A | 9/1999 | Chang et al. |
| 5,967,163 A | 10/1999 | Pan et al. |
| 5,969,250 A | 10/1999 | Greiff |
| 5,971,355 A | 10/1999 | Biegelsen et al. |
| 5,993,520 A | 11/1999 | Yu |
| 5,994,982 A | 11/1999 | Kintis et al. |
| 6,007,309 A | 12/1999 | Hartley |
| 6,016,092 A | 1/2000 | Qiu et al. |
| 6,032,923 A | 3/2000 | Biegelsen et al. |
| 6,033,852 A | 3/2000 | Andle et al. |
| 6,037,797 A | 3/2000 | Lagowski et al. |
| 6,040,611 A | 3/2000 | De Los Santos et al. |
| 6,043,727 A | 3/2000 | Warneke et al. |
| 6,046,659 A | 4/2000 | Loo et al. |
| 6,048,692 A | 4/2000 | Maracas et al. |
| 6,051,853 A | 4/2000 | Shimada et al. |
| 6,057,520 A | 5/2000 | Goodwin-Johansson |
| 6,069,540 A | 5/2000 | Berenz et al. |
| 6,089,534 A | 7/2000 | Biegelsen et al. |
| 6,094,102 A | 7/2000 | Chang et al. |
| 6,100,477 A | 8/2000 | Randall et al. |
| 6,106,245 A | 8/2000 | Cabuz |
| 6,119,691 A | 9/2000 | Angadjivand et al. |
| 6,120,002 A | 9/2000 | Biegelsen et al. |
| 6,123,316 A | 9/2000 | Biegelsen et al. |

| | | |
|---|---|---|
| 6,124,632 A | 9/2000 | Lo et al. |
| 6,126,140 A | 10/2000 | Johnson et al. |
| 6,127,744 A | 10/2000 | Streeter et al. |
| 6,127,812 A | 10/2000 | Ghezzo et al. |
| 6,149,190 A | 11/2000 | Galvin et al. |
| 6,168,395 B1 | 1/2001 | Quenzer et al. |
| 6,168,948 B1 | 1/2001 | Anderson et al. |
| 6,170,332 B1 | 1/2001 | MacDonald et al. |
| 6,177,351 B1 | 1/2001 | Beratan et al. |
| 6,181,009 B1 | 1/2001 | Takahashi et al. |
| 6,197,139 B1 | 3/2001 | Ju et al. |
| 6,199,874 B1 | 3/2001 | Galvin et al. |
| 6,204,737 B1 | 3/2001 | Ellä |
| 6,214,094 B1 | 4/2001 | Rousseau et al. |
| 6,238,946 B1 | 5/2001 | Ziegler |
| 6,255,758 B1 | 7/2001 | Cabuz et al. |
| 6,265,758 B1 | 7/2001 | Takahashi |
| 6,275,122 B1 | 8/2001 | Speidell et al. |
| 6,287,776 B1 | 9/2001 | Hefti |
| 6,324,914 B1 | 12/2001 | Xue et al. |
| 6,336,353 B2 | 1/2002 | Matsiev et al. |
| 6,384,353 B1 | 5/2002 | Huang et al. |
| 6,393,895 B1 | 5/2002 | Matsiev et al. |
| 6,395,638 B1 | 5/2002 | Linnemann et al. |
| 6,423,148 B1 | 7/2002 | Aoki |
| 6,431,212 B1 | 8/2002 | Hayenga et al. |
| 6,469,785 B1 | 10/2002 | Duveneck et al. |
| 6,470,754 B1 | 10/2002 | Gianchandani |
| 6,485,273 B1 | 11/2002 | Goodwin-Johansson |
| 6,496,348 B2 | 12/2002 | McIntosh |
| 6,504,118 B2 | 1/2003 | Hyman et al. |
| 6,580,280 B2 | 6/2003 | Nakae et al. |
| 6,597,560 B2 | 7/2003 | Potter |
| 6,626,417 B2 | 9/2003 | Winger et al. |
| 6,638,627 B2 | 10/2003 | Potter |
| 6,673,677 B2 | 1/2004 | Hofmann et al. |
| 6,674,132 B2 | 1/2004 | Willer |
| 6,688,179 B2 | 2/2004 | Potter et al. |
| 6,707,355 B1 | 3/2004 | Yee |
| 6,717,488 B2 | 4/2004 | Potter |
| 6,734,770 B2 | 5/2004 | Aigner et al. |
| 6,750,590 B2 | 6/2004 | Potter |
| 6,773,488 B2 | 8/2004 | Potter |
| 6,787,438 B1 | 9/2004 | Nelson |
| 6,798,132 B2 | 9/2004 | Satake |
| 6,841,917 B2 | 1/2005 | Potter |
| 6,842,009 B2 | 1/2005 | Potter |
| 6,854,330 B2 | 2/2005 | Potter |
| 7,195,393 B2 | 3/2007 | Potter |
| 7,211,923 B2 | 5/2007 | Potter |
| 7,217,582 B2 | 5/2007 | Potter |
| 2001/0047689 A1 | 12/2001 | McIntosh |
| 2002/0000649 A1 | 1/2002 | Tilmans et al. |
| 2002/0012937 A1 | 1/2002 | Tender et al. |
| 2002/0072201 A1 | 6/2002 | Potter |
| 2002/0131228 A1 | 9/2002 | Potter |
| 2002/0131230 A1 | 9/2002 | Potter |
| 2002/0182091 A1 | 12/2002 | Potter |
| 2002/0185003 A1 | 12/2002 | Potter |
| 2002/0187618 A1 | 12/2002 | Potter |
| 2002/0197761 A1 | 12/2002 | Patel et al. |
| 2003/0079543 A1 | 5/2003 | Potter |
| 2003/0079548 A1 | 5/2003 | Potter et al. |
| 2003/0080839 A1 | 5/2003 | Wong |
| 2003/0081397 A1 | 5/2003 | Potter |
| 2003/0112096 A1 | 6/2003 | Potter |
| 2003/0201784 A1 | 10/2003 | Potter |
| 2004/0023236 A1 | 2/2004 | Potter et al. |
| 2004/0113752 A1* | 6/2004 | Schuster ............... 338/310 |
| 2004/0145271 A1 | 7/2004 | Potter |
| 2004/0155555 A1 | 8/2004 | Potter |
| 2005/0035683 A1 | 2/2005 | Raisanen |
| 2005/0044955 A1 | 3/2005 | Potter |
| 2005/0186117 A1 | 8/2005 | Uchiyama et al. |
| 2005/0205966 A1 | 9/2005 | Potter |
| 2006/0131692 A1 | 6/2006 | Saitoh et al. |
| 2007/0074731 A1 | 4/2007 | Potter |

FOREIGN PATENT DOCUMENTS

| | | |
|---|---|---|
| JP | 62-297534 | 12/1987 |
| JP | 02-219478 A | 9/1990 |
| JP | 4-236172 | 8/1992 |
| JP | 08-308258 A | 11/1996 |
| JP | 2000-304567 A | 11/2000 |
| WO | WO97/31506 A1 | 8/1997 |

OTHER PUBLICATIONS

Brown, et al., "A Varactor-Tuned RF Filter," *IEEE Trans. on MTT*, pp. 1-4 (1999).

Cass, S., "Large Jobs for Little Devices," *IEEE Spectrum*, pp. 72-73 (2001).

Cui, Z., "Basic Information in Microfluidic System: A Knowledge Base for Microfluidic Devices," retrieved from the internet at http://web.archive.org/web/20011015071501/http://www.ccmicro.rl.ac.uk/info_microfluidics.html (Oct. 15, 2001).

Ilic et al., "Mechanical Resonant Immunospecific Biological Detector," *Appl. Phys. Lett.* 77(3):450-452 (2000).

Ilic et al., "Single Cell Detection with Micromechanical Oscillators," *J: Vac. Sci. Technol.* B 19(6):2825-2828 (2001).

Judy et al., "Surface Machined Micromechanical Membrane Pump," *IEEE*, pp. 182-186 (1991).

Kobayashi et al., "Distribution of Trapped Electrons at Interface State in ACTFEL Devices," *in* Proceedings of the Sixth International Workshop on Electroluminescence, El Paso, Texas, May 11-13 (1992).

Laser & Santiago, "A Review of Micropumps," *J. Micromech. Microeng.* 14:R35-R64 (2004).

Shoji & Esashi, "Microflow Devices and Systems," *J. Micromech. Microeng.* 4:157-171 (1994).

http://ucsub.colorado.edu/~maz/research/background.html [Retrieved from Web site on Apr. 4, 2001].

"Low-Power, High-Performance MEMS-Based Switch Fabric," at http://www.ece.ncsu.edu/erl/damemi/switchproj.html [Retrieved from Web site on Apr. 4, 2001].

http://www.eecs.umich.edu/RADLAB/rebeiz/Current_Research.html [Retrieved from Web site on Apr. 4, 2001].

"MEMS Technology Developers," at http://www.ida.org/DIVISIONS/std/MEMS/tech_fluids.html [Retrieved from the internet on Jun. 13, 2002].

Tada, Y., "Experimental Characteristics of Electret Generator, Using Polymer Film Electrets," *Jpn. J. Appl. Phys.* 31:846-851 (1992).

Sterken et al., "An Electret-Based Electrostatic μ-Generator," *12th International Conference on Solid State Sensors, Actuators and Microsytems*, pp. 1291-1294, Boston, MA (Jun. 8-12, 2003).

Peano & Tambosso, "Design and Optimization of MEMS Electret-Based Capacitive Energy Scavenger," *J. Microelectromechanical Systems* 14(3):429-435 (2005).

Tada, Y.., "Improvement of Conventional Electret Motors," *IEEE Transactions on Electrical Insulation* 28(3): 402-410 (1993).

Gracewski et al., "Design and Modeling of a Micro-Energy Harvester Using an Embedded Charge Layer," *J. Micromech. Microeng.* 16:235-241 (2006).

Jefimenko & Walker, "Electrostatic Current Generator Having a Disk Electret as an Active Element," *Transactions on Industry Applications* 1A-14(6):537-540 (1978).

Genda et al., "High Power Electrostatic Motor and Generator Using Electrets," *12th International Conference on Solid State Sensors, Actuators and Microsytems*, pp. 492-495, Boston, MA (Jun. 8-12, 2003).

\* cited by examiner

METHODS FOR DISTRIBUTED ELECTRODE INJECTION

CROSS REFERENCE TO RELATED APPLICATIONS

The present invention claims the benefit of U.S. Provisional Patent Application Ser. No. 60/498,891, filed Aug. 29, 2003, which is hereby incorporated by reference in its entirety. The subject invention was made with government support (Infotonics Technology Center (DOE)) Award No. DEFG02-02ER63410.A100. The U.S. Government may have certain rights.

FIELD OF THE INVENTION

The present invention generally relates to charge injection and, more particularly, to a method for distributed charge injection and a system thereof.

BACKGROUND

Embedded electronic charge technology is utilized in a variety of different types of MEMS devices and applications, such as those disclosed in U.S. Pat. Nos.: 6,597,560; 6,638,627; 6,688,179; 6,717,488; 6,750,590; and 6,773,488 and in U.S. Patent Application Publication Nos.: 2002/0131228; 2002/0182091; 2003/0079543; 2003/0201784; and 2004/0023236 by way of example. Embedded electronic charge technology is also extendable to a variety of applications in the macroscopic realm, such as heel strike power generation or for electrical generation from local environmental sources, such as the wind or waves.

These devices with embedded electronic charge use charge injection to trap charge at an interface of dissimilar insulators. Typically, the charge injection techniques used to embed the charge are high field injection or ballistic injection. High field injection requires a conducting material be placed on each side of the material into which charge is to be injected. The conducting materials on each side must be in substantial alignment with each other and a high voltage is applied across the conducting materials. Ballistic injection requires a ballistic charge source, such as an electron gun, a vacuum chamber, and a device to control energy, dose, and spatial coordinates of the ballistic charge source.

Unfortunately, it is difficult to inject electronic charge over an arbitrarily large surface and likewise to do so as a single step. If high field injection with conducting electrodes is used, a single defect, such as a short, in the material being injected will preclude charge injection. If ballistic injection is used, a very large and hence expensive vacuum chamber is required.

SUMMARY OF THE INVENTION

A method for injecting charge in accordance with embodiments of the present invention includes providing a target comprising a first layer on a second layer, coupling a conductive base to the second layer, and providing a medium which is in contact with at least a portion of the first layer. An electrode is positioned to face and is spaced from the first layer and is at least partially in contact with the medium. An electric field is provided across the first and second layers to inject charge to an interface between the first layer and the second layer.

A system for injecting charge in accordance with embodiments of the present invention includes a target comprising a first layer on a second layer, a conductive base to the second layer, a medium which is in contact with at least a portion of the first layer, an electrode and a electric field source, The electrode faces and is spaced from the first layer and is at least partially in contact with the medium. The electric field source provides an electric field across the first and second layers to inject charge to an interface between the first layer and the second layer.

The present invention provides a method and system for effectively establishing a desired charge density at trap sites at the interface of dissimilar insulators. The present invention is able to inject charge without the use of expensive systems and devices, such as vacuum chambers and ballistic electron sources. Furthermore, with the present invention there is no size constraint regarding the target into which charge is to be injected. Still further, the present invention can be used for charging other types of materials, such as a polymer electret film.

DETAILED DESCRIPTION

Figure 1:
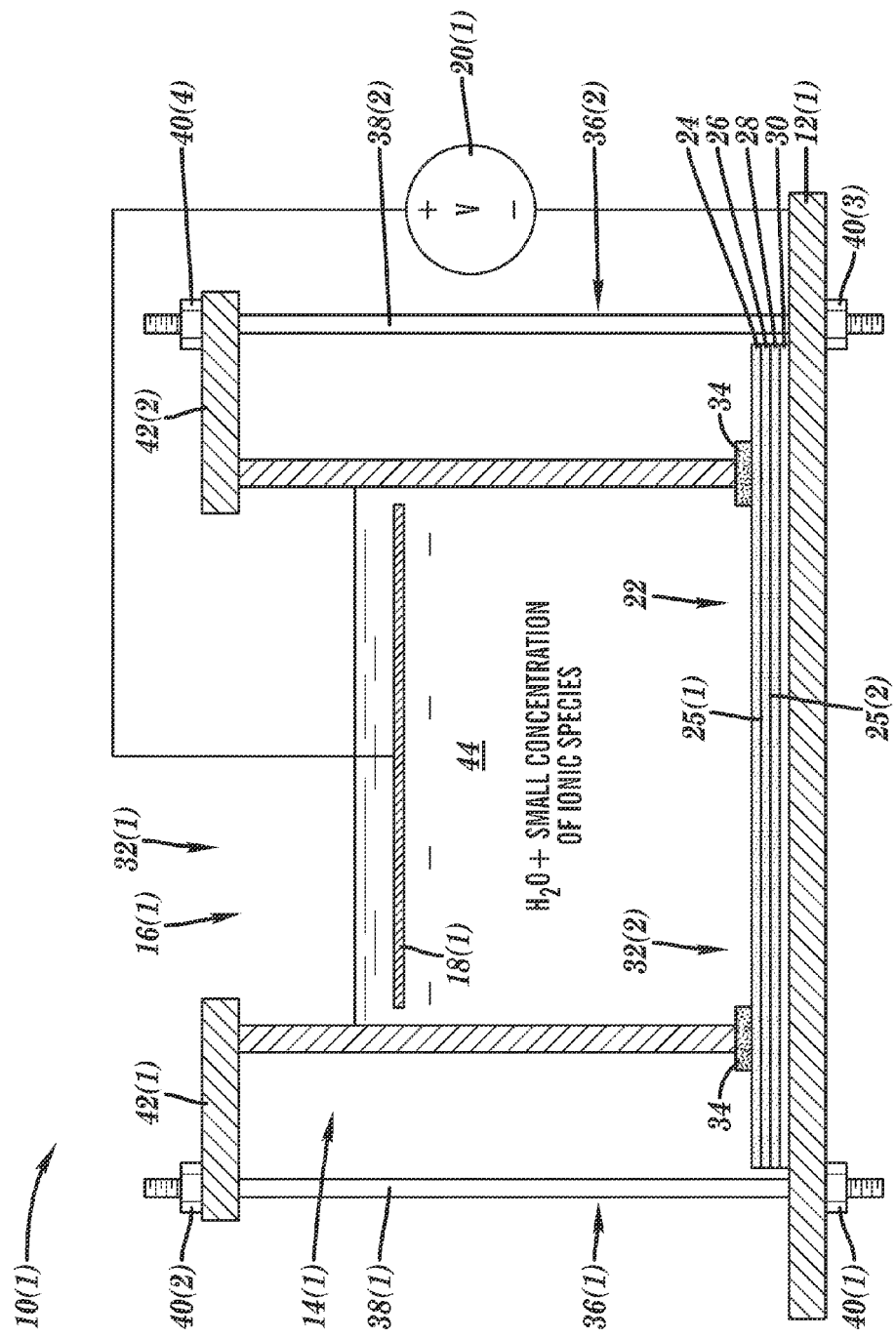
FIG. 1 is a cross-sectional view of a distributed electrode injection system for injecting charge into a target in accordance with embodiments of the present invention.

A distributed electrode injection system 10(1) in accordance with embodiments of the present invention is illustrated in FIG. 1. The distributed electrode injection system 10(1) includes a conductive base 12(1), a housing 14(1) with a chamber 16(1), an electrode 18(1), and a power source 20(1), although the system 10(1) can include other types and numbers of components arranged in other manners, such as the distributed electrode injection system 10(2) shown in FIG. 2. The present invention provides a number of advantages including a method and system for effectively establishing a desired charge density at trap sites at the interface of dissimilar insulators.

Referring more specifically to FIG. 1, a target 22 includes a layer of silicon dioxide ($SiO_2$) 24 on a layer of silicon nitride ($Si_3N_4$) 26 on a layer of silicon dioxide ($SiO_2$) 28 on a layer of silicon 30, although the target can comprise other types and numbers of layers. The layer of silicon dioxide 24, the layer of silicon nitride 26, and the layer of silicon dioxide 28 each have a thickness of about 100 nm, although each of the layers 24, 26, and 28 could have other thicknesses. An interface 25(1) is formed between layers 24 and 26 and another interface 25(2) is formed between layers 26 and 28, although the target 22 can have other numbers of layers with other numbers of interfaces for storing injected charge. The layer of silicon 30 is placed on and coupled to the conductive base 12(1), although the target 22 can be coupled to the conductive base 12(1) in other manners. A variety of different types of conducting materials can be used for the conductive base 12(1).

The housing 14(1) is a hollow cylinder which defines the chamber 16(1), although the housing 14(1) could have other shapes. The chamber 16(1) also has a cylindrical shape and has a pair of openings 32(1) and 32(2), although chamber 16(1) could have other shapes with other numbers of openings. A seal 34 is positioned around an outer edge of the opening 32(2) to the chamber 16(1) in the housing 14(1) and against the layer of silicon dioxide 24, although the housing 14(1) could be sealed against the target 22 in other manners. If electrode 18(1) is near the target 22, then sealing may not be required and housing 14(1) can be directly on conductive base 12(1). Housing 14(1) is made of an insulating material, although other materials could be used.

A pair of securing brackets 36(1) and 36(2) each comprising a threaded rod 38(1) or 38(2), nuts 40(1) and 40(2) or 40(3) and 40(4) and a clamping plate 42(1) or 42(2) are used to secure the housing 14(1), the target 22 and the conductive base 12(1) together, although the housing 14(1), the target 22 and/or the conductive base 12(1) can be connected together in other manners. By way of example only, a single clamping plate with an opening could be used in place of the clamping plates 42(1) and 42(2). Each of the rods 38(1) and 38(2) is threaded at each end for engagement with one of the nuts 40(1)-40(4). One end of each of the rods 38(1) and 38(2) extends partially through openings in the conductive base 12(1) and nuts 40(1) and 40(3) are respectively threaded on those ends of rods 38(1) and 38(2). Similarly, an opposing end of each of the rods 38(1) and 38(2) extends partially through openings in the clamping plates 42(1) and 42(2) and nuts 40(2) and 40(4) are respectively threaded on those ends of rods 38(1) and 38(2). When the housing 14(1) and target 22 are placed between the conductive base 12(1) and the clamping plates 42(1) and 42(2), the nuts 40(1)-40(4) are tightened on the threaded ends of the rods 38(1) and 38(2). Tightening the nuts 40(1)-40(4) secures the seal 34 around the opening 32(2) to the chamber 16(1) of the housing 14(1) against the layer of silicon dioxide 24 of the target 22.

The chamber 16(1) which is defined by the wall of the housing 14(1), the seal 34, and the layer of silicon dioxide 24 of the target 22 is partially filled with a medium 44. In these embodiments, the medium 44 is a fluid, such as water, with a low conductivity between about between about $1 \times 10^{-4}$ and $5 \times 10^{-8}$ siemens and a high permittivity above 80, although other types of mediums, such as a solid material or a solid in the form of a powder or other types of fluids, such as organic or mineral oil, can be used. For other mediums, the conductivity can have other ranges for conductivity, such as between about $1 \times 10^{-4}$ and $1 \times 10^{-10}$. Additionally, the medium 44 can have other conductivity and permittivity ranges.

The electrode 18(1) is positioned in the medium 44 in the chamber 16(1) and is spaced from the target 22. The spacing of the electrode 18(1) from the target 22 depends on the type of medium 44 in the chamber 16(1). For example, if the medium 44 is an extremely high resistivity liquid, such as $18 \times 10^6$ Ω-cm water, the electrode 18(1) may be close to the target 22, in this example about one cm to three cm apart. If the medium 44 is somewhat conductive with a conductivity of $1 \times 10^{-6}$ siemens for example, then the electrode 18(1) can be further from the target 22, in this example about three cm to ten cm apart, because most of the electric field appears across the target 22 into which charge is to be injected and stored. Other distances can be used, including on the order of as little as a few microns by way of example.

The power source 20(1) is coupled to the electrode 18(1) and to the conductive base 12(1) and supplies voltage to generate the electric field, which is used to inject the charge into the interface 25(1) between the layer of silicon dioxide 24 and the layer of silicon nitride 26 and into the interface 25(2) between the layer of silicon nitride 26 and the layer of silicon dioxide 28. A variety of different types of power sources can be used for the power source 20(1) and the amount of voltage applied to generate the electric field can vary based on the particular application.

Figure 2:
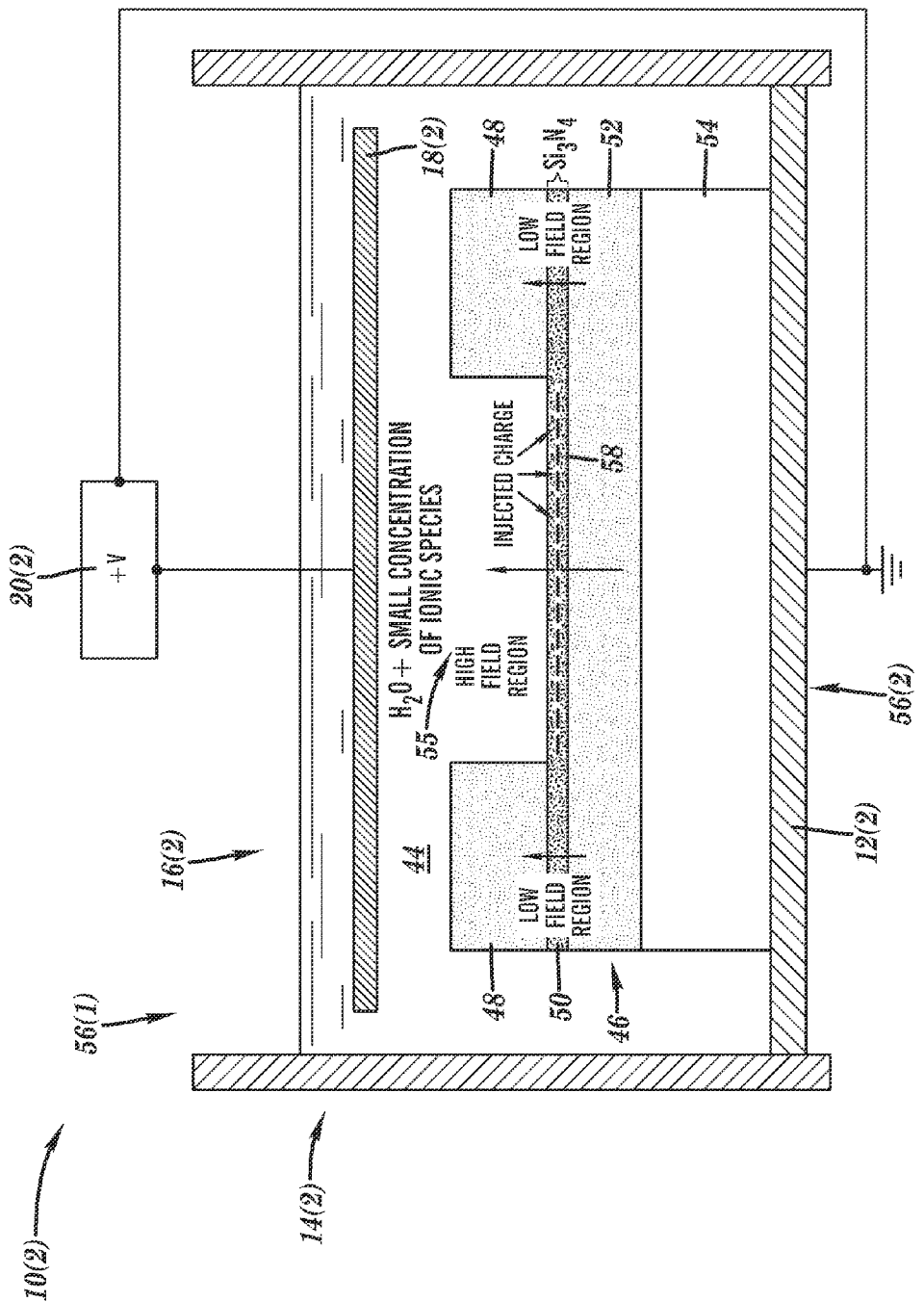
FIG. 2 is a cross-sectional view of a distributed electrode injection system for injecting charge into predefined areas on a target in accordance with other embodiments of the present invention.

Referring to FIG. 2, a distributed electrode injection system 10(2) in accordance with other embodiments of the present invention is illustrated. Elements in FIG. 2 which correspond to those disclosed with reference to FIG. 1 will have like reference numerals and will not be described again in detail.

A target 46 includes a layer of silicon dioxide ($SiO_2$) 48 on a layer of silicon nitride ($Si_3N_4$) 50 on a layer of silicon dioxide ($SiO_2$) 52 on a layer of silicon 54, although the target can comprise other types and numbers of layers. For example, other types of layers which have a low permittivity with respect to the medium 44 can be used for the layer of silicon dioxide 48. The layer of silicon dioxide 48 is etched to form an opening 55 which exposes a portion of the layer of silicon nitride 50, although the target 46 could be etched in other manners or could have no etchings. In this example, the layer of silicon dioxide 48 has a thickness of about one micron, the layer of silicon nitride 50 has a thickness of about 100 nm, and the layer of silicon dioxide 52 has a thickness of about 100 nm, although each of the layers 48, 50, and 52 could have other thicknesses. The layer of silicon 54 is placed on and coupled to the conductive base 12(2), although the target 46 can be coupled to the conductive base 12(2) in other manners. A variety of different types of conducting materials can be used for the conductive base 12(2).

The housing 14(2) is a hollow cylinder which defines the chamber 16(2), although the housing 14(2) could have other shapes. Housing 14(2) is made of an insulating material, although other materials could be used. The chamber 16(2) also has a cylindrical shape and has a pair of openings 56(1) and 56(2), although chamber 16(2) could have other shapes with other numbers of openings. The conductive base 12(2) is secured in the chamber 16(2) of the housing 14(2) adjacent the opening 56(2). The conductive base 12(2) seals the opening 56(2) to form a container in the chamber 16(2), although the opening 56(2) to the chamber 16(2) of the housing 14(2) could be sealed in other manners.

The chamber 16(2) which is defined by the wall of the housing 14(2) and the conductive base 12(2), is partially filled with the medium 44. The medium 44 is described in greater detail earlier. The electrode 18(2) is positioned in the medium 44 in the chamber 16(2) and is spaced from the target 46. The spacing of the electrode 18(2) from the target 46 also depends on the type of medium 44 in the chamber 16(2), on the power supply 12(2) and applied voltage, and on the material properties and geometry of the target 46 as described earlier with respect to electrode 18(1) and target 22.

The power source 20(2) is coupled to the electrode 18(2) and to the conductive base 12(2) and supplies power to generate the electric field which is used to inject the charge into the interface 58 between the layer of silicon nitride 50 and the layer of silicon dioxide 52 in the etched region 55. A variety of different types of power sources can be used for the power source 20(2).

A method for injecting charge in accordance with embodiments of the present invention will now be described with reference to FIG. 1. A surface of the layer of silicon 30 for the target 22 is placed on the conductive base 12(1) which couples the layer of silicon 30 to the conductive base 12(1). The seal 34 is positioned around an outer edge of the opening 32(2) to the chamber 16(1) in the housing 14(1). The seal 34 around the outer edge of the opening 32(2) to the chamber 16(1) in the housing 14(1) is placed against a surface of the layer of silicon dioxide 24.

The clamping plates 42(1) and 42(2) are positioned around the other end of the housing 14(1) adjacent the opening 32(1) so that the housing 14(1) and target 22 are between the conductive base 12(1) and the clamping plates 42(1) and 42(2). The nuts 40(1)-40(4) are tightened on the threaded ends of the rods 38(1) and 38(2) which brings the clamping plates 42(1) and 42(2) towards the conductive base 12(1) and secures the seal 34 around the opening 32(2) to the chamber 16(1) of the housing 14(1) against the layer of silicon dioxide 24 of the target 22.

Next, the chamber 16(1) is partially filled with the medium 44. Since the medium 44, in this example water with low ionic concentration, has sufficiently high resistance, local shorting paths, such as pinholes in the target 22, only preclude charge injection in the immediate vicinity of the pinhole. This effect is insignificant since it is limited to only local defect areas.

The electrode 18(1) is placed in the medium 44 and is spaced from the target 22, although the electrode could be placed in the chamber 16(1) before the medium 44 is introduced. The distance for the spacing of the electrode 18(1) from the target 22 depends on the type of medium 44 in the chamber 16(1), on the power supply 12(2) and applied voltage, and on the material properties and geometry of the target 22 as explained earlier.

The power source 20(1) is coupled to the electrode 18(1) and to the conductive base 12(1) and applies a bias across the electrode 18(1) and the conductive base 12(1) which generates an electric field which is used to inject the charge into the interface 25(1) between the layer of silicon dioxide 24 and the layer of silicon nitride 26 and into the interface 25(2) between the layer of silicon nitride 26 and the layer of silicon dioxide 28. The system 10(1) is analogous to a voltage divider. Since the effective resistivity of the target 22 is large with respect to the resistivity of the medium 44, in this example low conductivity water, most of the potential is dropped across the target 22. With an appropriate applied bias level by the power source 12(1) which provides an electric field equal to or greater than the electric field necessary for charge injection, electrons are injected from the layer of silicon 30 into the target 22. Electrons are trapped at trap sites at interfaces 25(1) and 25(2) and remain there. Charge levels exceeding $1\times10^{13}$ e$^-$/cm$^2$ have been experimentally achieved using this system 10(1) and method. The charge trapped at the interfaces 25(1) and 25(2) is monopole charge.

For situations where the positive electrode 18(1) is relatively close to the region subjected to charge injection, in this example layer 24, using a voltage source 12(1) with sufficiently high current capability, an edge seal 34 may not be required. The low conductivity fluid between about $1\times10^{-4}$ and $5\times10^{-8}$ siemens for the medium 44 will maintain the field virtually across the entire target 22.

To demonstrate the effectiveness of this method and the insensitivity to local defects, a target 22 was placed in the system 10(1) and, instead of high resistivity water, high concentration salt water was used for the medium 44. With the salt water being highly conductive, bubbles indicated short sites or pinholes and the applied voltage could not be increased to greater than a few volts due to the maximum current limitation of the power supply 12(1). Hence no charge injection was detected. The system 10(1) and the same target 22 were cleaned and placed in the chamber 16(1) again, but this time with low ionic concentration water as the medium 44. The voltage was sustainable and significant charge injection was determined by post charge injection electrical characterization.

A method for injecting charge in accordance with other embodiments of the present invention will now be described with reference to FIG. 2. The method described with respect to FIG. 2 is the same as the one described above with reference to FIG. 1, except as described below.

The opening 55 is etched into a target 46 at the location in which charge is to be injected, although the target 46 could be etched in other locations or could have no etchings. A surface of the layer of silicon 54 is placed on the conductive base 12(2) which couples the target 46 to the conductive base 12(2).

The chamber 16(2) is partially filled with the medium 44 and electrode 18(2) is positioned in the medium 44 in the chamber 16(2) and is spaced from the target 46. The spacing of the electrode 18(2) from the target 46 also depends on the type of medium 44 in the chamber 16(2) as described earlier.

The power source 20(2) is coupled to the electrode 18(2) and to the conductive base 12(2) and applies a bias across the electrode 18(2) and the conductive base 12(2). This bias generates the electric field, which is used to inject the charge into the interface 58 between the layer of silicon nitride 50 and the layer of silicon dioxide 52 in the etched region 55. Since charge injection is exponentially dependent on field, only areas with a sufficient electric field will result in charge injection. In this example, the opening 55 which exposed a portion of the layer of silicon nitride 50 is the only area with a sufficient electric field for charge injection. The remaining portion of the layer of silicon nitride 50 is covered by the layer of silicon dioxide 48 which prevents a sufficient field from being generated and thus from any charge injection occurring in that area The charge, in this example electrons, is trapped at the interface 25 and is a monopole charge. Accordingly, the above-described method is effective for injecting charge in predefined areas, such as specific devices on an appropriate silicon wafer.

Figure 3A:
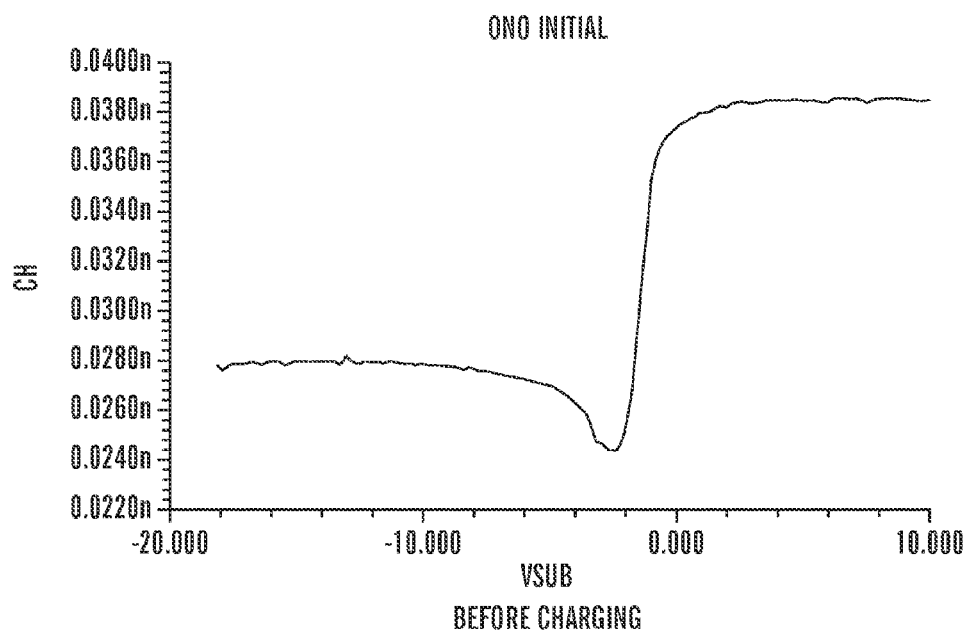
FIG. 3A is a graph of capacitance-voltage characteristics before distributed electrode charge injection.
Figure 3B:
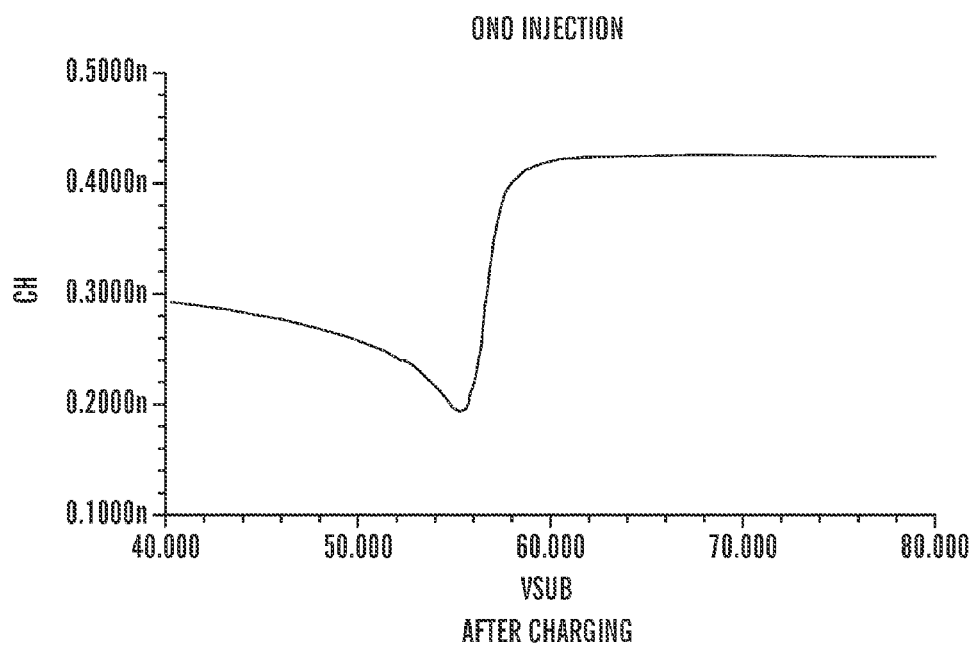
FIG. 3B is a graph of capacitance-voltage characteristics after distributed electrode charge injection.

Referring to FIGS. 3A and 3B, graphs of the capacitance-voltage (C-V) response for layer of silicon oxide on a layer of silicon nitride on and layer of silicon oxide on a lightly doped n type silicon substrate before and after distributed electronic charge injection are illustrated As can be seen, a significant change is observed ($C_{min}$ to $C_{max}$ transition voltage) indicating a high level of injected, and subsequently stored, charge. These capacitance-voltage tests were performed using liquid metal, in this case InGa, as top electrode. Therefore, the areas of the capacitors were not known and varied for testing before and after charge injection. The area is not necessary for this test. Only the shift in the transition from $C_{min}$ to $C_{max}$ is required to determine the stored charge density.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method for injecting charge, the method comprising:
providing a target comprising a first layer on a second layer;
coupling a conductive base to the second layer;
providing a housing which defines a chamber, the conductive base is adjacent to an opening to the chamber;
providing a medium which is in contact with at least a portion of the first layer, wherein the providing a medium further comprises filling at least a portion of the chamber with the medium, wherein at least a portion of the target is substantially covered by the medium;
positioning an electrode which faces and is spaced from the first layer, wherein the electrode is at least partially in contact with the medium, wherein the positioning the electrode further comprises disposing the electrode at least partially in the medium in the chamber on an opposing side of the target from the conductive base; and
providing an electric field across the first and second layers to inject charge to an interface between the first layer and the second layer.

2. The method as set forth in claim 1 wherein the housing is made of a non-conducting material.

3. The method as set forth in claim 1 further comprising securing the opening of the chamber of the housing against a portion of the first layer.

4. The method as set forth in claim 3 further comprising sealing the opening of the chamber against the portion of the first layer.

5. The method as set forth in claim 1 wherein the conductive base is secured across the opening to the chamber in the housing.

6. The method as set forth in claim 1 wherein the medium has a conductivity between about $1 \times 10^{-4}$ and $1 \times 10^{-10}$ siemens.

7. The method as set forth in claim 1 wherein the medium is one of a fluid and a solid.

8. The method as set forth in claim 1 wherein the first and second layers are dissimilar insulators.

9. The method as set forth in claim 1 wherein the charge trapped at the interface is monopole charge.

10. A method for injecting charge, the method comprising:
providing a target comprising a first layer on a second layer, wherein the target further comprises a third layer on first layer;
coupling a conductive base to the second layer;
providing a medium which is in contact with at least a portion of the first layer;
positioning an electrode which faces and is spaced from the first layer, wherein the electrode is at least partially in contact with the medium; and
providing an electric field across the first and second layers to inject charge to an interface between the first layer and the second layer.

11. The method as set forth in claim 10 further comprising removing a portion of the third layer to expose a portion of the first layer under the removed portion of the third layer, wherein the remaining portion of the third layer substantially prevents the injection of the charge to a portion of the interface between the first layer and the second layer covered by the remaining portion of the third layer.

12. The method as set forth in claim 10 wherein the first layer comprises silicon nitride, the second layer comprises silicon dioxide, and the third layer comprises silicon dioxide.

13. The method as set forth in claim 10 wherein the target further comprises a substrate on the second layer.

14. A method for injecting charge, the method comprising:
providing a target comprising a first layer on a second layer and a third layer on the second layer;
coupling a conductive base to the second layer;
providing a medium which is in contact with at least a portion of the first layer;
positioning an electrode which faces and is spaced from the first layer, wherein the electrode is at least partially in contact with the medium; and
providing an electric field across the first and second layers to inject charge to an interface between the first layer and the second layer.

15. The method as set forth in claim 14 wherein the first layer comprises silicon dioxide, the second layer comprises silicon nitride, and the third layer comprises silicon dioxide.

16. The method as set forth in claim 14 wherein the target further comprises a substrate on the third layer.

* * * * *